(12) United States Patent
Xing et al.

(10) Patent No.: US 8,760,165 B2
(45) Date of Patent: Jun. 24, 2014

(54) PHASE SHIFTER AND POWER AMPLIFIER AND MAGNETIC RESONANCE IMAGING APPARATUS

(75) Inventors: Haoyang Xing, Beijing (CN); Yu Liu, Beijing (CN); Anmou Liao, Beijing (CN); Chenxing Zhao, Beijing (CN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 519 days.

(21) Appl. No.: 13/116,718

(22) Filed: May 26, 2011

(65) Prior Publication Data

US 2011/0291728 A1    Dec. 1, 2011

(30) Foreign Application Priority Data

May 31, 2010   (CN) .......................... 2010 1 0193734

(51) Int. Cl.
*G01R 33/36* (2006.01)
*H03H 11/20* (2006.01)
*H03H 11/22* (2006.01)
*H03F 1/32* (2006.01)

(52) U.S. Cl.
CPC ........ *G01R 33/3607* (2013.01); *G01R 33/3614* (2013.01); *H03H 11/20* (2013.01); *H03H 11/22* (2013.01); *H03F 1/32* (2013.01); *G01R 33/36* (2013.01)
USPC ............................ 324/322; 324/318; 327/252

(58) Field of Classification Search
CPC .................... H03F 1/32; H03H 11/20; G01R 33/20–33/64; A61B 5/05–5/068; G01V 3/00–3/40; G01N 24/00–24/14
USPC ............... 324/300–322, 76.77; 600/407–435; 382/128–131; 327/252; 330/151, 295
See application file for complete search history.

(56) References Cited

U.S. PATENT DOCUMENTS

| | | | | | |
|---|---|---|---|---|---|
| 2,036,319 | A | * | 4/1936 | Case | 331/105 |
| 2,441,028 | A | * | 5/1948 | Matthews | 455/191.3 |
| 2,768,236 | A | * | 10/1956 | Allison | 73/585 |
| 2,859,403 | A | * | 11/1958 | Kirchner | 324/319 |
| 3,013,149 | A | * | 12/1961 | Harasek | 455/130 |
| 3,054,947 | A | * | 9/1962 | Kass et al. | 324/545 |
| 3,414,824 | A | * | 12/1968 | Weidmann et al. | 327/558 |
| 3,594,637 | A | * | 7/1971 | Beckwith | 324/76.77 |
| 4,032,857 | A | * | 6/1977 | Lum | 330/151 |
| 4,965,530 | A | * | 10/1990 | Katz | 330/295 |
| 5,668,705 | A | | 9/1997 | Balch et al. | |
| 6,031,746 | A | | 2/2000 | Steigerwald et al. | |
| 6,166,602 | A | | 12/2000 | Steigerwald et al. | |
| 2011/0291728 | A1 | * | 12/2011 | Xing et al. | 327/252 |

* cited by examiner

*Primary Examiner* — Melissa Koval
*Assistant Examiner* — Tiffany Fetzner
(74) *Attorney, Agent, or Firm* — Armstrong Teasdale LLP

(57) ABSTRACT

A phase shifter is provided. The phase shifter includes a first phase shifter that is continuously adjustable within a range of 0 degrees to 90 degrees, two 4-way switches each configured to selectively switch on one of a capacitance, an inductance, an open circuit, and a short circuit under control of a control voltage, and a bridge. A first input end and a first output end of said bridge are respectively connected to a first 4-way switch of the two 4-way switches. A second input end of said bridge is connected to an output end of said first phase shifter or a second output end of said bridge is connected to an input end of said first phase shifter.

20 Claims, 3 Drawing Sheets

PHASE SHIFTER AND POWER AMPLIFIER AND MAGNETIC RESONANCE IMAGING APPARATUS

CROSS-REFERENCE TO RELATED APPLICATIONS

This application claims the benefit of Chinese Patent Application No. 201010193734.8 filed May 31, 2010, which is hereby incorporated by reference in its entirety.

BACKGROUND OF THE INVENTION

The present invention generally relates to very low frequency field, and especially relates to a phase shifter and power amplifier and magnetic resonance imaging apparatus in the nuclear magnetic resonance imaging technology.

The nuclear magnetic resonance imaging technology is applied broadly in the medical field at present. The magnetic resonance imaging (MRI) is also called nuclear magnetic resonance imaging (NMRI), which is a diagnostic method that generates an image by atomic nucleus resonance in the magnetic field. The basic principle is forming an image by utilizing the inherent characteristics of atomic nucleus and the interaction of a magnetic field. A type of atomic nucleus closely related to tissues of the human body generates magnetic resonance signals under the effect of an external radio frequency field. A set of parameters related to the magnetic resonance may serve as imaging variables. A power amplifier is one of the components within a magnetic resonance imaging apparatus.

As is known, power amplifier linearity technology, for example, feedback, feed forward and predistortion, etc., is the mainstream in enhancing the Adjacent Channel Power Ratio (ACPR) and improving the power amplifier linearity. This technology compares the amplitude and phase of the input signal and the output signal, thus, the phase shift function of a phase shifter is employed.

A known current phase shifter is shown in FIG. 1. In the current phase shifter, capacitance C1 and C2 are connected in series between an input port Pin and an output port Pout. A diode 8 and a diode 9 connected in parallel are grounded at one end and are connected to a capacitance C3 at the other end. The other end of the capacitance C3 is connected to an inductance L. The other end of the inductance L is connected between the capacitance C1 and C2. A control voltage is applied between the capacitance C3 and the diodes 8, 9 connected in parallel via a resistance R1. For example, the input port Pin and the output port Pout are ports with 50 Ohm, where the working frequency is about 64 Mhz, the capacitances C1, C2 and C3 are approximately 3.3 nF, the inductance L is about 47 nH, and the resistance R1 is about 1 k Ohm. Other values may be possible. As shown in FIG. 1, the impedance of the diode 8 and diode 9 will vary with the changes of the bias voltage. The changes of the impedances of the diode 8 and diode 9 inevitably cause phase variation from the output port Pout to the input port Pin, thereby achieving the purpose of phase shift. However, the changes of the phase shift caused by this example is about 26 degrees, thus the range of phase shift is too small, while the insertion loss is rather large, which influences system gain and noise.

Another known current phase shift is shown in FIG. 2. An input port Pin is connected to an input end of a bridge 3, and an output port Pout is connected to an isolation port of the bridge 3. The anodes of two varactors 4 and 5 are respectively connected to two power dividing ports of the bridge 3. The two power dividing ports are also respectively connected to grounding resistance R2 and R5. The cathodes of the two varactors 4 and 5 are respectively connected to resistance R3 and R4 and are connected in series with a control voltage. A capacitance C4 is connected to control voltage at one end, and is grounded at the other end. Resistances R2, R3, R4, R5 provide current protection and voltage bias for the two varactors, and the capacitance C4 performs the function of blocking and filtering. This type of phase shift technology is very popular and may be applied to many fields, especially in mobile communication and radar fields. In this example, it is assumed that the input port Pin and the output port Pout are ports with 50 Ohm. It can be seen from FIG. 2 that the reactances of the varactor 4 and varactor 5 vary with the variation of the control voltage, so the phase variation of the emitted signals will be different, and thus a phase delay is realized.

Compared to the phase shifter shown in FIG. 1, the phase shifter shown in FIG. 2 shifts phase in a broader range, however, it is difficult to realize a phase shift of 180 degrees.

SUMMARY OF THE INVENTION

The embodiments described herein provide a phase shifter and power amplifier and magnetic resonance imaging apparatus by which a phase shift range of 0 degrees to 360 degrees can be realized.

More specifically, the phase shifter described herein includes a first phase shifter continuously adjustable within the range of 0 degrees to 90 degrees. The phase shifter includes a bridge and two 4-way switches. An input end and an output end of the bridge are respectively connected to one 4-way switch. The two 4-way switches are designed to selectively switch on one of a capacitance, an inductance, an open circuit, and a short circuit under the control of a control voltage. Another input end of the bridge is connected to an output end of the first phase shifter, or another output end of the bridge is connected to an input end of the first phase shifter.

The control voltage is one of 00, 01, 10, 11 in binary form.

The selection of the capacitance and the inductance is dependent on a working frequency.

The first phase shifter includes a bridge and two varactors, an input port connected to an input end of the bridge, and an output port connected to an isolation port of the bridge. The two varactors are respectively connected to two power dividing ports of the bridge. Resistances R2, R3, R4, R5 provide current protection and voltage bias for the two varactors In another aspect, the power amplifier of the includes a phase shifter, and the phase shifter includes a first phase filter that is continuously adjustable within the range of 0 degrees to 90 degrees. The phase shifter further includes a bridge and two 4-way switches. An input end and an output end of the bridge are respectively connected to one 4-way switch. The two 4-way switches are designed to selectively switch on one of a capacitance, an inductance, an open circuit, and a short circuit under the control of a control voltage. Another input end of the bridge is connected to an output end of the first phase shifter, or another output end of the bridge is connected to an input end of the first phase shifter.

The control voltage is one of 00, 01, 10, 11 in binary form.

The selection of the capacitance and the inductance is dependent on a working frequency.

The first phase shifter includes a bridge and two varactors, an input port connected to an input end of the bridge, and an output port connected to an isolation end of the bridge. The two varactors are respectively connected to two power dividing ports of the bridge. Resistances R2, R3, R4, R5 provide current protection and voltage bias for the two varactors.

Correspondingly, the magnetic resonance imaging apparatus includes the power amplifier described above.

Compared with known phase shifters, the phase shifter and power amplifier and magnetic resonance imaging apparatus described herein have the following advantageous effects.

First, because the embodiments described herein include two 4-way switches and a bridge, when the two 4-way switches are selected to switch on the capacitance, a phase shift of 0 degrees is generated. When the two 4-way switches are selected to switch on the open circuit, a phase shift of 90 degrees is generated. When the two 4-way switches are selected to switch on the inductance, a phase shift of 180 degrees is generated. When the two 4-way switches are selected to switch on the short circuit (i.e. grounding), a phase shift of 270 degrees is generated. Moreover, a first phase shifter is continuously adjustable in shifting a phase from 0 degrees to 90 degrees, thus a phase shift that is continuously adjustable from 0 degrees to 360 degrees can be realized.

Second, because this type of phase shifter has little insertion loss, the matching of standing waves of the input and output ports are nice. This type of phase shifter is very important for a high power amplifier, as it not only can reduce power loss, but also can avoid self-excitation of power amplifier. Further, the phase shifter is easy to control and is convenient to use.

BRIEF DESCRIPTION OF THE DRAWINGS

For a thorough understanding of the present disclosure, reference will be made to the description in combination with the figures, in which.

DETAILED DESCRIPTION OF THE INVENTION

The embodiments of the present invention will be described in detail as follows, however, the present invention is not limited to the following embodiments.

Figure 2:
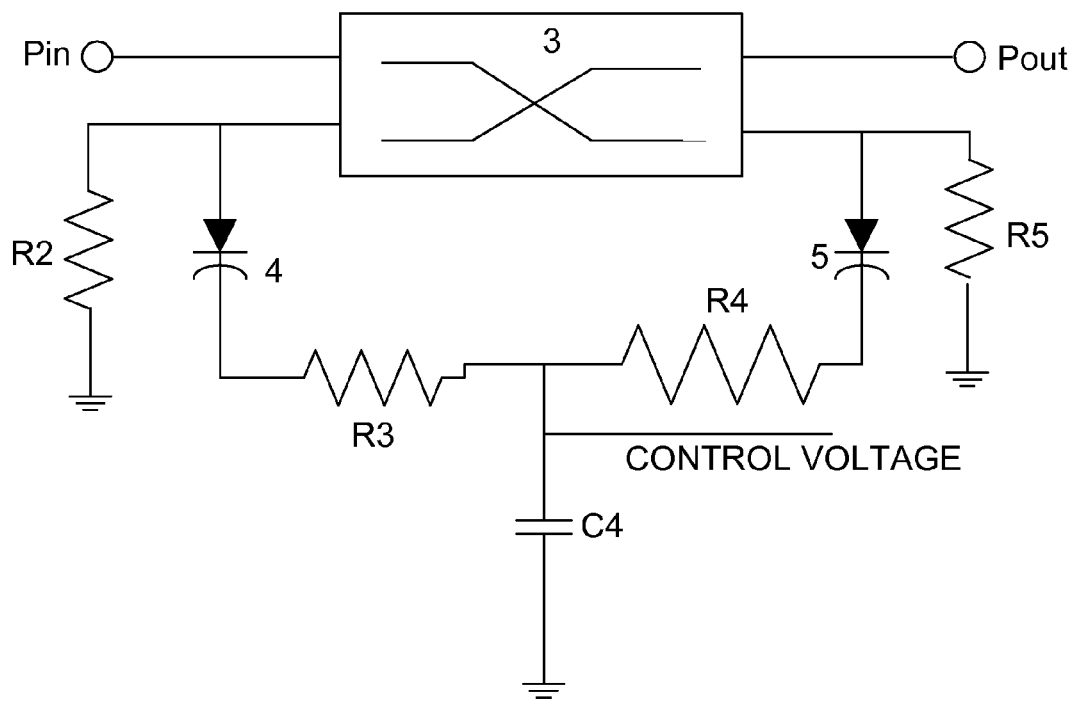
FIG. 2 is a structural schematic diagram of another phase shifter of the prior art.
Figure 3:
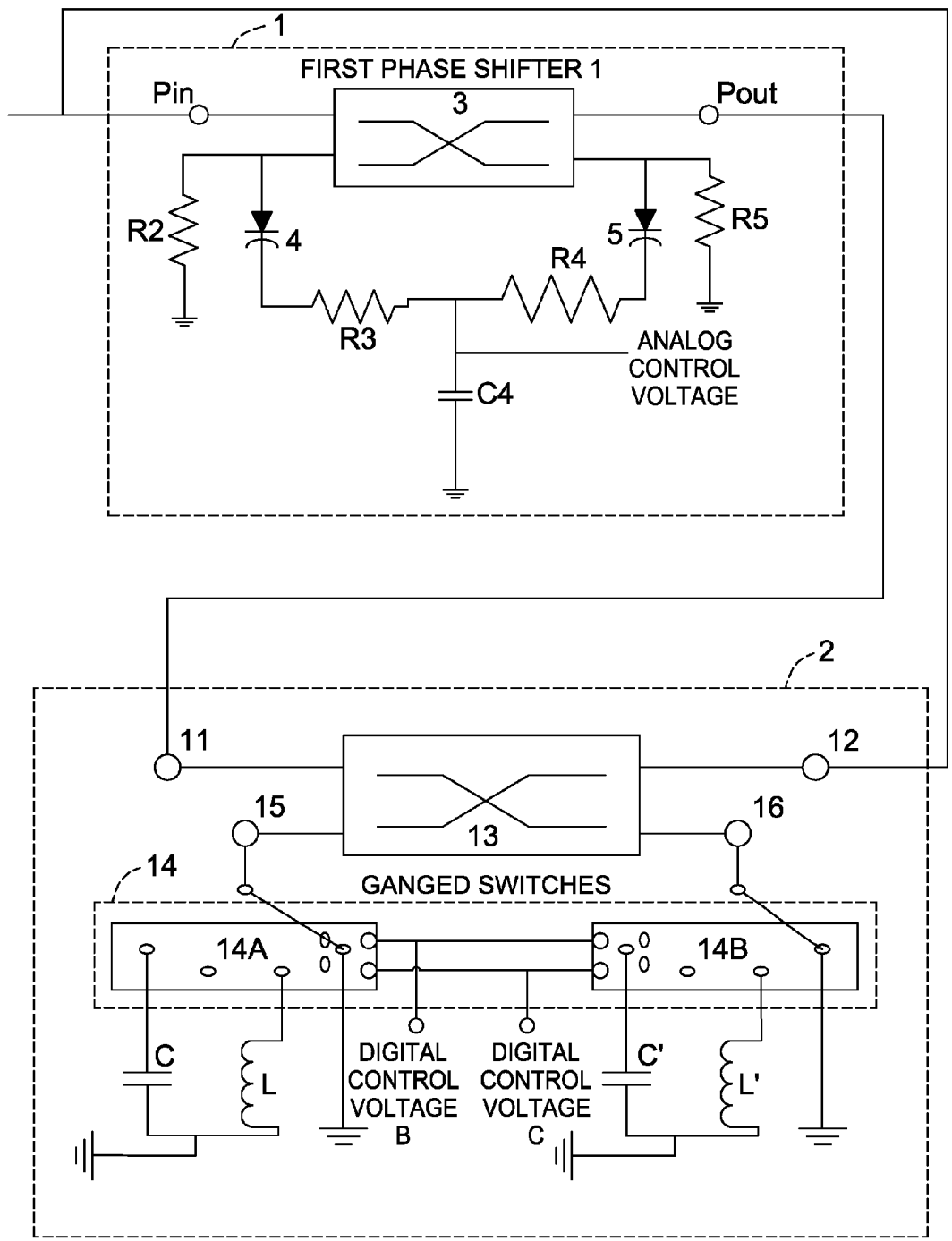
FIG. 3 is a schematic diagram of a phase shifter in accordance with the present invention.

As shown in FIG. 3, the phase shifter includes a first phase shifter 1 (such as the phase shifter shown in FIG. 2) that is continuously adjustable within a range of 0 degrees to 90 degrees, a bridge 13, and a switching unit 14 that includes two ganged 4-way switches 14A and 14B. The bridge 13 and the switching unit 14 form a second phase shifter 2. An input end 15 of the bridge 13 is connected to the 4-way switch 14A, and an output end 16 of the bridge 13 is connected to the 4-way switch 14B. The 4-way switch 14A is designed to selectively switch on one of a capacitance C, an inductance L, an open circuit, and a short circuit under the control of control voltages B and C. The 4-way switch 14B is designed to selectively switch on one of a capacitance C', an inductance L', an open circuit, and a short circuit under the control of control voltages B and C. Another input end 11 of the bridge 13 is connected to an output end of the first phase shifter 1. Another output end 12 of the bridge 13 may be connected to an input end of the first phase shifter 1.

As seen from the above, the 4-way switches 14A and 14B respectively have four selections and may be controlled by digital control voltages B and C. When the 4-way switch 14A is selected to switch on the capacitance C and the 4-way switch 14B is selected to switch on the capacitance C', the phase variation between the input end 11 and the output end 12 of the bridge 13 is 0 degrees, i.e., there is no phase shift. When the ganged 4-way switches 14A and 14B are both selected to be open circuit, the phase variation between the input end 11 and the output end 12 of the bridge 13 is 90 degrees, i.e., the phase shift is 90 degrees. When the 4-way switch 14A is selected to switch on the inductance L and the 4-way switch 14B is selected to switch on the inductance L', the phase variation between the input end 11 and the output end 12 of the bridge 13 is 180 degrees, i.e., the phase shift is 180 degrees. When the ganged 4-way switches 14A and 14B are both selected to switch on short circuit (i.e. grounding), the phase variation between the input end 11 and the output end 12 of the bridge 13 is 270 degrees, i.e., the phase shift is 270 degrees.

Thus, phase shift of 0 degrees, 90 degrees, 180 degrees, and 270 degrees can be realized by the structure of the bridge 13 and the two ganged 4-way switches 14A and 14B.

Figure 1:
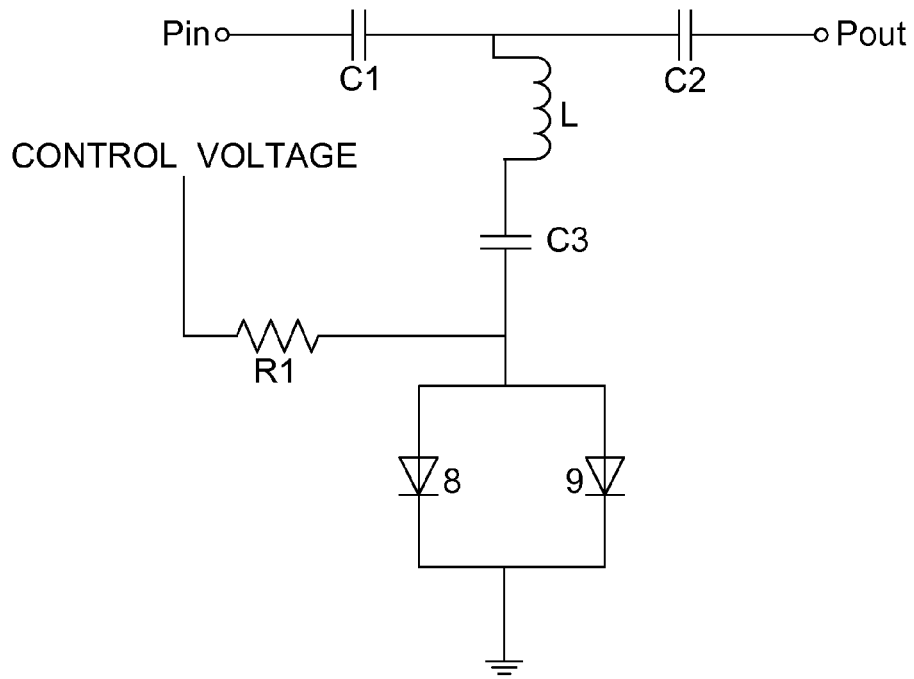
FIG. 1 is a structural schematic diagram of a phase shifter of the prior art.

Again, as shown in FIG. 1, the first phase shifter 1 is a phase shifter the is continuously adjustable from 0 degrees and 90 degrees. More specifically, the phase shift range of the first phase shifter 1 is from 0 degrees and 90 degrees. In other words, the first phase shifter 1 can shift phase to any degree from 0 degrees to 90 degrees.

If the input end of the first phase shifter 1 is made as the input port of the phase shifter, the output end of the first phase shifter 1 is connected to the input end 11 of the bridge 13, and if the output end 12 of the bridge 13 is made as the output port of the phase shifter of the present invention, the phase difference between the input port and the output port may be at four phase regions: 0 degrees-90 degrees; 90 degrees-180 degrees; 180 degrees-270 degrees; 270 degrees-360 degrees. In other words, the phase difference between the input port and the output port may be any value from 0 degrees to 360 degrees. Thus, a continuously adjustable phase shift from 0 degrees to 360 degrees is realized.

As for digital control voltages B and C, they only need to control the ganged 4-way switches 14A and 14B to make a selection. For example, they may be binary 00, 01, 10, 11, respectively for controlling the ganged 4-way switches 14A and 14B to selectively switch on one of the capacitance (C, C'), inductance (L, L'), open circuit and short circuit.

The selection for the capacitance C, C' and inductance L, L' is dependent on the working frequency.

For example, assuming that the working frequency is 64 MHz, a capacitance of about 50 pF should be selected for the capacitance C and C', and an inductance of about 125 nH should be selected for the inductance L and L'. Radio frequency switches should be selected as the two ganged 4-way switches 14A and 14B, and a 3 dB bridge should be selected as the bridge 13. Thus, when the two ganged 4-way switches 14A and 14B are selected to switch on the capacitance C and C', or to switch on the inductance L and L', a phase variation of 0 degrees and 180 degrees may be respectively generated between the input port and the output port, and the insertion loss is about 0 dB, as shown in Table 1 as follows.

TABLE 1

| X | dB(S(2, 1)) freq = 64000000.000 | phase(S(2, 1)) freq = 64000000.000 |
| --- | --- | --- |
| 1.000 | −2.840E−6 | −0.441 |

Wherein, "1.000" in X represents the first item of simulation, dB(S(2,1)) represents the insertion loss or gain between the output and input ports, Phase(S(2,1)) represents the phase difference between the output and input ports, the frequency is 64 MHZ. This is the result of selecting a 50 PF capacitance by the switch.

TABLE 2

| X | dB(S(2, 1))<br>freq = 64000000.000 | phase(S(2, 1))<br>freq = 64000000.000 |
|---|---|---|
| 1.000 | −2.881E−6 | 179.558 |

In the table 2, the result of selecting a 125 nH inductance by the switch is presented.

Any phase shifter that is continuously adjustable from 0 degrees to 90 degrees may be used as the first phase shifter 1. The phase shifter shown in FIG. 2 may serve as the first phase shifter 1.

Figure 4:
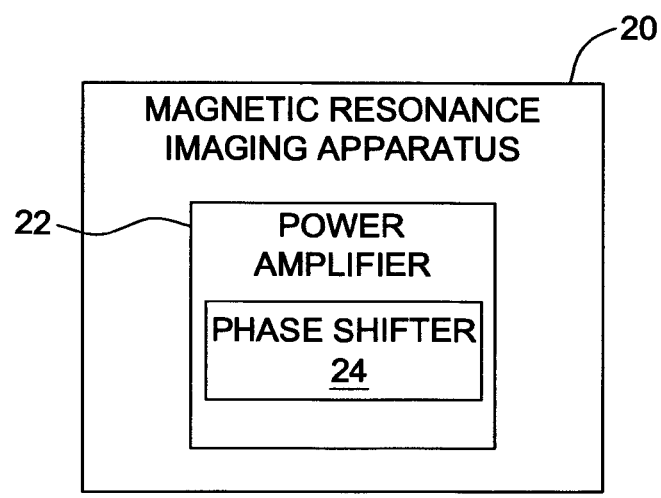
FIG. 4 is a schematic diagram of an exemplary magnetic resonance imaging apparatus that includes a power amplifier.

Further, as shown in FIG. 4, a power amplifier 22 includes a phase shifter 24, such as the phase shifter shown in FIG. 3. Accordingly, referring to FIG. 3, the phase shifter includes a phase shifter 1 that is continuously adjustable within a range of 0 degrees to 90 degrees. The phase shifter further includes a bridge 13 and two ganged 4-way switches 14A and 14B. An input end 15 and an output end 16 of the bridge 13 are respectively connected to one 4-way switch each. An input end 15 of the bridge 13 is connected to the 4-way switch 14A, and an output end 16 of the bridge 13 is connected to the 4-way switch 14B. The 4-way switch 14A is designed to selectively switch on one of a capacitance C, an inductance L, an open circuit, and a short circuit under the control of digital control voltages B and C. The 4-way switch 14B is designed to selectively switch on one of a capacitance C', an inductance L', an open circuit, and a short circuit under the control of control voltages B and C. Another input end 11 of the bridge 13 is connected to an output end of the first phase shifter 1. Another output end of the bridge 13 may be connected to an input end of the first phase shifter 1.

As seen from the above, the ganged 4-way switches 14A and 14B respectively have four selections and may be controlled by digital control voltages B and C. When the 4-way switch 14A is selected to switch on the capacitance C and the 4-way switch 14B is selected to switch on the capacitance C', the phase variation between the input end 11 and the output end 12 of the bridge 13 is 0 degrees, i.e., there is no phase shift. When the ganged 4-way switches 14A and 14B are both selected to be open circuit, the phase variation between the input end 11 and the output end 12 of the bridge 13 is 90 degrees, i.e., the phase shift is 90 degrees. When the 4-way switch 14A is selected to switch on the inductance L and the 4-way switch 14B is selected to switch on the inductance L', the phase variation between the input end 11 and the output end 12 of the bridge 13 is 180 degrees, i.e., the phase shift is 180 degrees. When the ganged 4-way switches 14A and 14B are both selected to switch on short circuit (i.e. grounding), the phase variation between the input end 11 and the output end 12 of the bridge 13 is 270 degrees, i.e., the phase shift is 270 degrees.

Thus, phase shift of 0 degrees, 90 degrees, 180 degrees, and 270 degrees can be realized by the structure of the bridge 13 and the two ganged 4-way switches 14A and 14B.

Again, as shown in FIG. 1, the first phase shifter 1 is a phase shifter that is continuously adjustable from 0 degrees and 90 degrees. More specifically, the phase shift range of the first phase shifter 1 is from 0 degrees and 90 degrees. In other words, the phase shifter 1 can shift phase to any angle from 0 degrees to 90 degrees.

If the input end of the first phase shifter 1 is made as the input port of the phase shifter, the output end of the first phase shifter 1 is connected to the input end 11 of the bridge 13, and is the output end 12 of the bridge 13 is made as the output port of the phase shifter, the phase difference between the input port and the output port may be at four phase regions: 0 degrees-90 degrees; 90 degrees-180 degrees; 180 degrees-270 degrees; 270 degrees-360 degrees. That is, the phase difference between the input port and the output port may be any value from 0 degrees to 360 degrees. Thus, a continuously adjustable phase shift from 0 degrees to 360 degrees is realized.

As for digital control voltages B and C, they only need to control the ganged 4-way switches 14A and 14B to make a selection. For example, they may be binary 00, 01, 10, 11, respectively for controlling the 4 ganged 4-way switches 14A and 14B to switch on one of the capacitance (C, C'), inductance (L, L'), open circuit and short circuit.

The selection for the capacitance C, C' and inductance L, L' is dependent on the working frequency.

Because the power amplifier includes the phase shifter that is continuously adjustable from 0 degrees to 360 degrees as described above, the linearity of the power amplifier described herein is very nice. Moreover, signals will not be distorted and the power may be even greater.

In another aspect, as shown in FIG. 4, a magnetic resonance imaging apparatus 20 is provided. The magnetic resonance imaging apparatus 20 includes the power amplifier 24 described above. Since the power amplifier 24 has been described in detail in the text above, here we will not go further on it.

Although the embodiments of the present invention have been described in combination with the figures in the text above, yet those skilled in the art may make various variation, modification and equivalence on the present invention without departing from the spirit and scope of the present invention. These variation, modification and equivalence are intended to fall within the spirit and scope defined by the appended claims.

The invention claimed is:

1. A phase shifter that is compatible with a magnetic resonance imaging apparatus, the phase shifter comprising:
    a first phase shifter that is continuously adjustable within a range of 0 degrees to 90 degrees;
    two ganged 4-way switches, each configured to selectively switch between and actively switch on, one of a capacitance, an inductance, an open circuit, and a short circuit under control of a digital control voltage; and
    a bridge, wherein:
        a first input end and a first output end of said bridge are respectively connected to one 4-way switch of the two ganged 4-way switches; and
        one of a second input end of said bridge is connected to an output end of said first phase shifter and a second output end of said bridge is connected to an input end of said first phase shifter.

2. A phase shifter according to claim 1, wherein said control voltage is one of 00, 01, 10, 11 in binary form.

3. A phase shifter according to claim 1, wherein said two ganged 4-way switches select the capacitance and the inductance depending on a working frequency.

4. A phase shifter according to claim 1, wherein said first phase shifter comprises:

a bridge and two varactors, wherein the two varactors are respectively connected to two power dividing ports of the bridge;
an input port connected to an input end of the bridge;
an output port connected to an isolation port of the bridge; and
a plurality of resistances configured to provide current protection and voltage bias for the two varactors.

5. A power amplifier comprising a phase shifter that is compatible with a magnetic resonance imaging apparatus, the phase shifter comprising:
a first phase shifter that is continuously adjustable within a range of 0 degrees to 90 degrees;
two ganged 4-way switches, each configured to selectively switch between and actively switch on, one of a capacitance, an inductance, an open circuit, and a short circuit under control of a digital control voltage; and
a bridge, wherein:
a first input end and a first output end of said bridge are respectively connected to one 4-way switch of the two ganged 4-way switches; and
one of a second input end of said bridge is connected to an output end of said first phase shifter and a second output end of the bridge is connected to an input end of said first phase shifter.

6. A power amplifier according to claim 5, wherein the control voltage is one of 00, 01, 10, 11 in binary form.

7. A power amplifier according to claim 5, wherein the two ganged 4-way switches select the capacitance and the inductance depending on a working frequency.

8. A power amplifier according to claim 5, wherein said first phase shifter comprises:
a bridge and two varactors, wherein the two varactors are respectively connected to two power dividing ports of the bridge;
an input port connected to an input end of the bridge;
an output port connected to an isolation port of the bridge; and
a plurality of resistance configured to provide current protection and voltage bias for the two varactors.

9. A magnetic resonance imaging apparatus comprising:
a power amplifier comprising;
a phase shifter that is compatible with the magnetic resonance imaging apparatus comprising:
a first phase shifter that is continuously adjustable within a range of being 0 degrees to 90 degrees;
two ganged 4-way switches each configured to selectively switch between and actively switch on, one of a capacitance, an inductance, an open circuit, and a short circuit under control of a digital control voltage; and
a bridge, wherein:
a first input end and a first output end of said bridge are respectively connected to one 4-way switch of the two ganged 4-way switches; and
one of a second input end of said bridge is connected to an output end of said first phase shifter and a second output end of the bridge is connected to an input end of said first phase shifter.

10. A magnetic resonance imaging apparatus in accordance with claim 9, wherein the control voltage is one of 00, 01, 10, 11 in binary form.

11. A magnetic resonance imaging apparatus in accordance with claim 9, wherein the two ganged 4-way switches select the capacitance and the inductance depending on a working frequency.

12. A magnetic resonance imaging apparatus in accordance with claim 9, wherein said first phase shifter comprises:
a bridge and two varactors, wherein the two varactors are respectively connected to two power dividing ports of the bridge;
an input port connected to an input end of the bridge;
an output port connected to an isolation port of the bridge; and
a plurality of resistance configured to provide current protection and voltage bias for the two varactors.

13. A phase shifter according to claim 1, wherein the two ganged 4-way switches are configured to generate a phase shift of 0 degrees when the two ganged 4-way switches switch the capacitance on.

14. A phase shifter according to claim 1, wherein the two ganged 4-way switches are configured to generate a phase shift of 90 degrees when the two ganged 4-way switches switch the open circuit on.

15. A phase shifter according to claim 1, wherein the two ganged 4-way switches are configured to generate a phase shift of 180 degrees when the two ganged 4-way switches switch the inductance on.

16. A phase shifter according to claim 1, wherein the two ganged 4-way switches are configured to generate a phase shift of 270 degrees when the two ganged 4-way switches switch the short circuit on.

17. A power amplifier according to claim 5, wherein the two ganged 4-way switches are configured to generate a phase shift of 0 degrees when the two ganged 4-way switches switch the capacitance on.

18. A power amplifier according to claim 5, wherein the two ganged 4-way switches are configured to generate a phase shift of 90 degrees when the two ganged 4-way switches switch the open circuit on.

19. A power amplifier according to claim 5, wherein the two ganged 4-way switches are configured to generate a phase shift of 180 degrees when the two ganged 4-way switches switch the inductance on.

20. A power amplifier according to claim 5, wherein the two ganged 4-way switches are configured to generate a phase shift of 270 degrees when the two ganged 4-way switches switch the short circuit on.

* * * * *